United States Patent
Terashima

(10) Patent No.: US 6,586,780 B1
(45) Date of Patent: *Jul. 1, 2003

(54) SEMICONDUCTOR DEVICE FOR SUPPLYING OUTPUT VOLTAGE ACCORDING TO HIGH POWER SUPPLY VOLTAGE

(75) Inventor: Tomohide Terashima, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 936 days.

(21) Appl. No.: 08/931,688

(22) Filed: Sep. 16, 1997

Related U.S. Application Data

(63) Continuation of application No. 08/626,104, filed on Apr. 3, 1996.

(30) Foreign Application Priority Data

Oct. 30, 1995 (JP) ............................................. 7-281547

(51) Int. Cl.[7] .............................................. H01L 29/74
(52) U.S. Cl. ......................... 257/140; 257/110; 257/132
(58) Field of Search .............................. 257/64, 75, 76, 257/82, 83, 84, 110, 132, 140, 146, 205, 207, 500, 526, 539, 551, 552, 567, 568, 569, 570; 326/109; 327/389, 419, 427, 432, 433, 436, 485, 487

(56) References Cited

U.S. PATENT DOCUMENTS

| | | | | |
|---|---|---|---|---|
| 4,069,494 A | * | 1/1978 | Grundy | 357/41 |
| 4,261,002 A | * | 4/1981 | Roger | 357/46 |
| 4,672,245 A | * | 6/1987 | Majumdar et al. | 307/570 |
| 4,794,441 A | * | 12/1988 | Sugawara et al. | 357/38 |

(List continued on next page.)

FOREIGN PATENT DOCUMENTS

| | | |
|---|---|---|
| EP | 0 294 888 A2 | 12/1988 |
| EP | 0 348 051 A1 | 12/1989 |
| EP | 0 348 051 | 12/1989 |
| EP | 0 350 178 A2 | 1/1990 |
| EP | 0 372 087 | * 6/1990 |
| EP | 0 372 087 A1 | 6/1990 |
| JP | 62-032722 | 2/1987 |
| JP | 4-30571 | 2/1992 |
| JP | 07283408 | 10/1995 |

OTHER PUBLICATIONS

Horowitz and Hill, The Art of Elecronics, Cambridge U. Press, pp. 166–167, 1989.*

German Patent Office Action dated Jul. 23, 1997 and English translation thereof.

*Primary Examiner*—Olik Chaudhuri
*Assistant Examiner*—Douglas A. Wille
(74) *Attorney, Agent, or Firm*—McDermott, Will & Emery

(57) ABSTRACT

A semiconductor device includes a p type semiconductor substrate, a first n type region formed at the semiconductor substrate, a first n channel DMOS transistor formed in the first n type region, a second n type region formed at the semiconductor substrate, a vertical type pnp bipolar transistor formed in the second n type region, and a second n channel DMOS transistor formed in the second n type region. The first n channel DMOS transistor has a drain for receiving a high power supply voltage (Vdc) and a source for supplying an output voltage (Vout). The bipolar transistor has a base connected to the gate of the first n channel DMOS transistor, an emitter connected to the source of the first n channel DMOS transistor, and a collector connected to the ground. The second n channel DMOS transistor has a drain connected to the gate of the first n channel DMOS transistor and a source connected to the ground.

13 Claims, 12 Drawing Sheets

U.S. PATENT DOCUMENTS

| | | | | |
|---|---|---|---|---|
| 4,979,001 A | * 12/1990 | Alter | ............................ | 357/13 |
| 4,989,127 A | * 1/1991 | Wegener | ....................... | 363/16 |
| 5,113,087 A | 5/1992 | Ueno | | |
| 5,357,393 A | * 10/1994 | Mojaradi et al. | .............. | 361/56 |
| 5,376,816 A | * 12/1994 | Nishigoori et al. | .......... | 257/370 |
| 5,418,383 A | * 5/1995 | Takagi et al. | ................... | 257/48 |
| 5,442,220 A | * 8/1995 | Arai | ............................ | 257/378 |
| 5,455,447 A | * 10/1995 | Hutter et al. | ................ | 257/545 |

* cited by examiner

US 6,586,780 B1

SEMICONDUCTOR DEVICE FOR SUPPLYING OUTPUT VOLTAGE ACCORDING TO HIGH POWER SUPPLY VOLTAGE

This application is a continuation of application Ser. No. 08/626,104 filed Apr. 3, 1996.

BACKGROUND OF THE INVENTION

1. Field of the Invention

The present invention relates to a semiconductor device, and more particularly to a semiconductor device which supplies a prescribed output voltage according to a high power supply voltage in response to an internally generated signal.

2. Description of the Background Art

In order to drive a plasma display or the like, a high driving voltage (e.g., 100 V) is required and thus a high voltage semiconductor integrated circuit device (HVIC) is employed. A conventional structure of an output stage incorporated in such an HVIC is shown in FIG. 12. An equivalent circuit of the structure shown in FIG. 12 is the same as that of Embodiment 1 shown in FIG. 2, which will be described later. As shown in FIG. 2, this output stage is formed by a half bridge of an n channel D (Double Diffused) MOS transistor. A pnp bipolar transistor 107, resistor elements 109, 111 and an n channel DMOS transistor 113 in FIG. 2 are not shown in FIG. 12.

Referring to FIG. 12, an n⁻ type epitaxial layer 20 is formed on a p⁻ type semiconductor substrate 10. This epitaxial layer 20 is electrically isolated by p⁺ type isolating diffused regions 31 to 34 to be divided into island regions IR1, IR3, and IR4.

An n channel DMOS transistor 101 is formed in island region IR1. The source of this DMOS transistor 101 is formed by n⁺ type diffused regions 61 and 62. The drain of DMOS transistor 101 is formed by n type diffused region 81, epitaxial layer 20 and the like. The gate of DMOS transistor 101 is formed on a p type diffused region 51.

A Zener diode 105 is formed in island region IR3. The anode of Zener diode 105 is formed by a p⁻ type diffused region 71. The cathode of Zener diode 105 is formed by an n⁺ type diffused region 63.

An n channel DMOS transistor 103 is formed in island region IR4. The source of DMOS transistor 103 is formed by an n⁺ diffused region 64. The drain of DMOS transistor 103 is formed by an n⁺ type diffused region 66 and epitaxial layer 20. The gate electrode 93 of DMOS transistor 103 is formed on a p type diffused region 53.

A high power supply voltage Vdc of, for example, 100 V is supplied externally to this HVIC. In response to the signal generated in HVIC, output voltage Vout is changed between high power supply voltage Vdc and a ground (common) voltage.

A control signal generated by a logic circuit (not shown) in the HVIC is applied to the gates of DMOS transistors 103 and 113. When DMOS transistor 103 is turned on and DMOS transistor 113 is turned off, gate charge of DMOS transistor 101 is discharged and output terminal 104 is short-circuited to a ground terminal 106 through Zener diode 105, by DMOS transistor 103. As a result, output voltage Vout drops from high power supply voltage Vdc (e.g., 100 V) to ground voltage COM (0 V). Meanwhile, when DMOS transistor 103 is turned off and DMOS transistor 113 is turned on, a voltage is generated between two ends of a resistor element 109 by the power flowing to DMOS transistor 113. Accordingly, a bipolar transistor 107 is turned on so that gate voltage of DMOS transistor 101 is increased, and as a result, DMOS transistor 101 is turned on. Therefore, output voltage Vout is increased from ground voltage COM (0 V) to high power supply voltage Vdc (e.g., 100 V).

In the above-described conventional structure, there has been a problem that the chip size of this HVIC is made large since the area occupied by Zener diode 105 is large. The increase in the chip size owing to a single Zener diode 105 is small, but an HVIC generally includes many output stages, and thus the increase in the chip size owing to Zener diodes 105 cannot be ignored.

In addition, since the breakdown voltage of DMOS transistor 103 must be set high, the threshold voltage of DMOS transistor 103 tends to be high. Accordingly, DMOS transistor 103 cannot be turned on sufficiently with the voltage of the logical level. Thus, there has been a problem that on-resistance of DMOS transistor 103 is increased and the dropping rate of output voltage Vout from high power supply voltage Vdc to ground voltage COM is reduced.

SUMMARY OF THE INVENTION

Based upon the foregoing, it is an object of the present invention to provide a semiconductor device having a small size.

It is another object of the present invention to provide a semiconductor device in which the dropping rate of output voltage is fast.

According to one aspect of the present invention, a semiconductor device for supplying a prescribed output voltage according to high power supply voltage in response to an internally generated signal includes a first region, a first MOS transistor, a second region, a Zener diode and a second MOS transistor. The first region is formed at a semiconductor substrate. The first MOS transistor is formed at the first region, and has a drain receiving the high power supply voltage and a source supplying the output voltage. The second region is formed at the semiconductor substrate and is electrically isolated from the first region. The Zener diode is formed at the second region and has an anode connected to the source of the first MOS transistor and a cathode connected to the gate of the first MOS transistor. The second MOS transistor is formed at the second region and has a drain connected to the gate of the first MOS transistor and a source which is connected to the ground.

In this semiconductor device, the Zener diode and the second MOS transistor are formed at the same region so that the area occupied by the Zener diode is reduced. Accordingly, the size of this semiconductor device is made small.

According to another aspect of the present invention, a semiconductor device for supplying a prescribed output voltage according to a high power supply voltage in response to an internally generated signal includes a first MOS transistor, a bipolar transistor, and a second MOS transistor. The first MOS transistor has a drain receiving a high power supply voltage and a source supplying an output voltage. The bipolar transistor has a base connected to the gate of the first MOS transistor, an emitter connected to the source of the first MOS transistor, and a collector which is connected to the ground. The second MOS transistor has a drain connected to the gate of the first MOS transistor and a source which is connected to the ground.

In this semiconductor device, the current flowing to the second MOS transistor is amplified by the bipolar transistor so that the dropping rate of the output voltage is made faster. In addition, since the emitter and the base of the bipolar transistor function as a Zener diode, a high power supply voltage is applied between the gate and the source of the first MOS transistor and thus destruction of its gate film is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
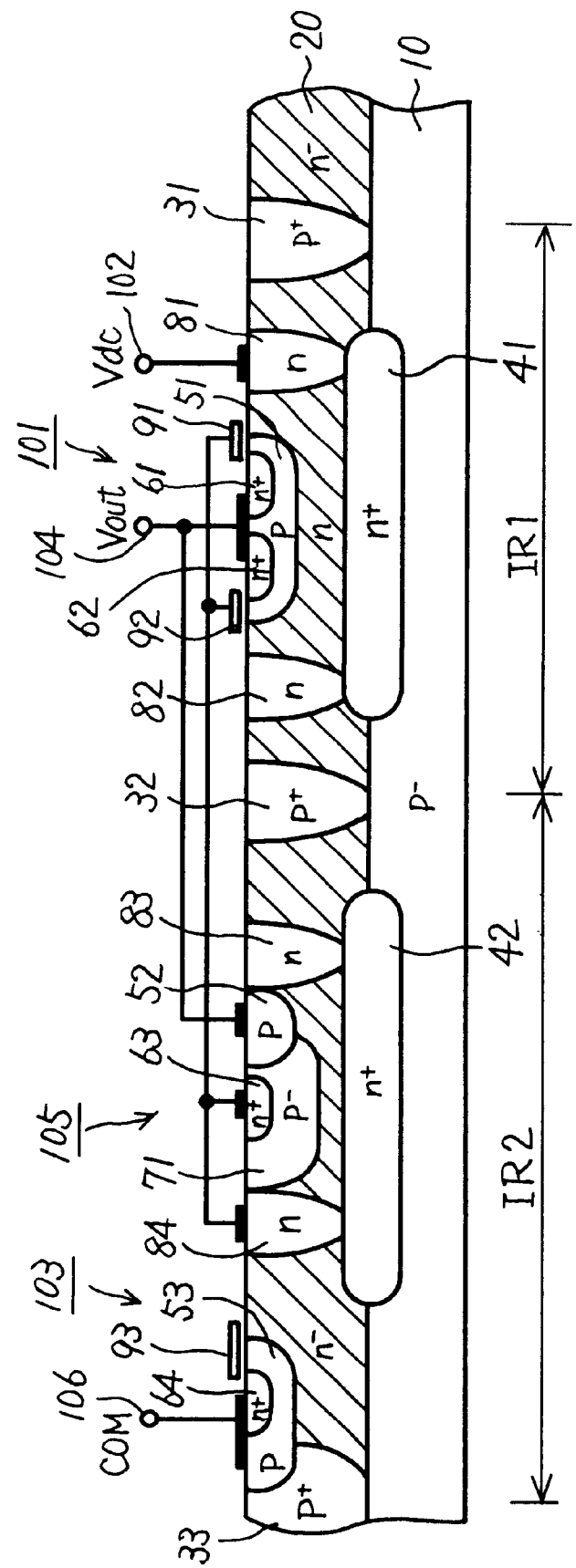
FIG. 1 is a schematic cross sectional view showing a structure of a semiconductor device according to Embodiment 1 of the present invention.

Embodiments of the present invention will be described hereinbelow in detail with reference to the figures. In the figures, the same reference characters denote the same or corresponding portions.

[Embodiment 1]

Figure 2:
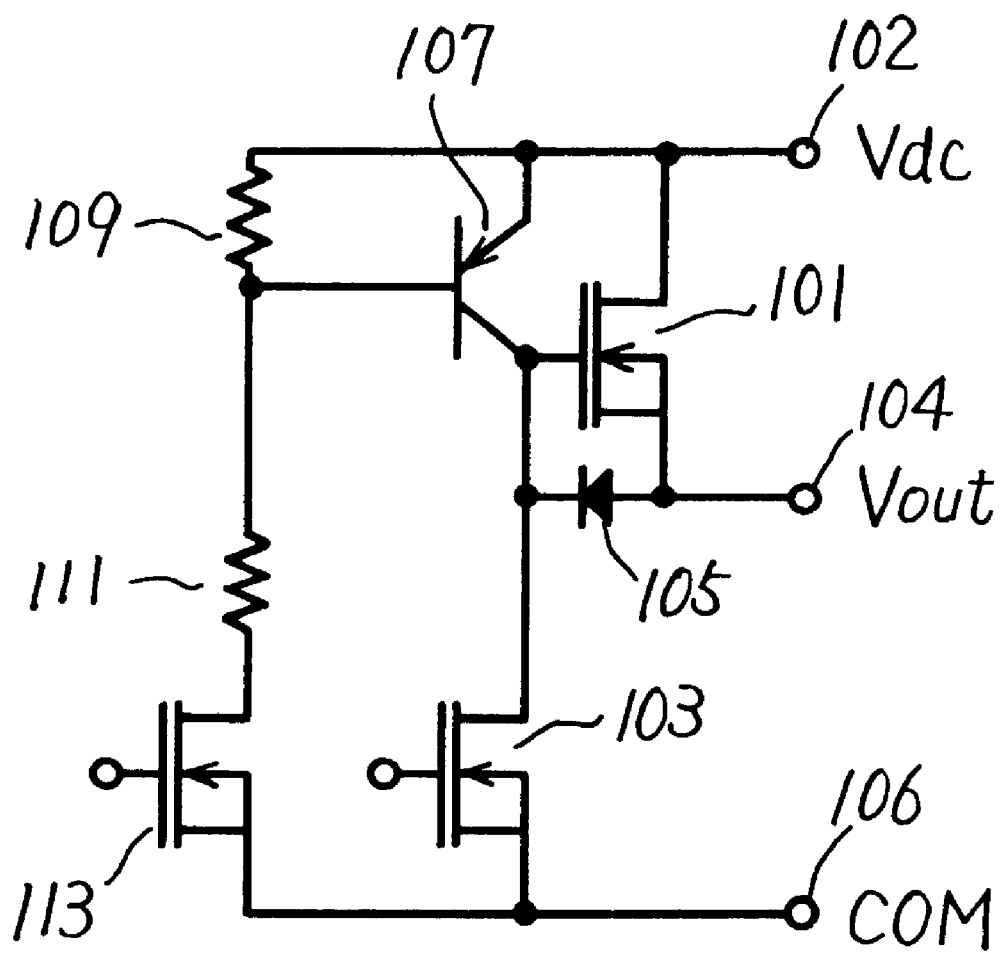
FIG. 2 shows an equivalent circuit of the semiconductor device of FIG. 1.

FIG. 1 is a schematic cross sectional view showing a structure of a semiconductor device according to Embodiment 1 of the present invention. FIG. 2 shows an equivalent circuit of the structure shown in FIG. 1. However, while an n channel MOS transistor 101, a Zener diode 105, and an n channel MOS transistor 103 in FIG. 2 are also shown in FIG. 1, an npn bipolar transistor 107, resistor elements 109 and 111, and an n channel DMOS transistor 113 are not shown in FIG. 1.

Referring to FIG. 1, this semiconductor device includes a p$^-$ type semiconductor substrate 10, an n$^-$ type epitaxial layer 20 formed on semiconductor substrate 10, n$^+$ type buried diffused regions 41 and 42 formed at the interface of semiconductor substrate 10 and epitaxial layer 20, p$^+$ type isolating diffused regions 31 to 33 formed in epitaxial layer 20 to reach semiconductor substrate 10, n type diffused regions 81 to 84 formed in epitaxial layer 20 to reach buried diffused regions 41 and 42, a p$^-$ type diffused region 71 formed shallower than diffused regions 81 to 84 in epitaxial layer 20, p type diffused regions 51 to 53 formed shallower than diffused region 71 in epitaxial layer 20, an n$^+$ type diffused region 61 formed shallower than diffused regions 51 to 53 in epitaxial layer 20, and gates 91 to 93 of polycrystalline silicon or the like formed on diffused regions 51 and 53 with an oxide film (not shown) therebetween.

Epitaxial layer 20 is electrically isolated by isolating diffused regions 31 to 33 to form island regions IR1 and IR2. In island region IR1, n$^-$ type epitaxial layer 20, n$^+$ type buried diffused region 41, n type diffused regions 81 and 82 form an n type well. In island region IR2, n$^-$ type epitaxial layer 20, buried diffused region 42, n type diffused regions 83 and 84 form an n type well. The n channel DMOS transistor 101 shown in FIG. 2 is formed in island region IR1. DMOS transistor 101 consists of a drain formed by n type diffused region 81 and n$^-$ type epitaxial layer 20, a source formed by n$^+$ type diffused region 61 and 62, and gates 91 and 92 formed of polycrystalline silicon. DMOS transistor 101 has its drain connected to a power supply terminal 102 and its source connected to an output terminal 104. The p type diffused region 51 forms a backgate of DMOS transistor 101. This backgate and the above-mentioned source are commonly connected at output terminal 104.

Zener diode 105 and n channel DMOS transistor 103 shown in FIG. 2 are formed in island region IR2. Zener diode 105 has an anode formed by diffused regions 52 and 71 as well as a cathode formed by a diffused region 63. The anode of Zener diode 105 is connected to the source of DMOS transistor 101. The cathode of Zener diode 105 is connected to the gate of DMOS transistor 101.

In addition, n channel DMOS transistor 103 has a drain formed by diffused region 84 and epitaxial layer 20, a source formed of a diffused region 64, and gate 93 formed of polycrystalline silicon or the like. Diffused region 53 forms a backgate of DMOS transistor 103. The source and the backgate of DMOS transistor 103 is commonly connected at ground terminal 106. DMOS transistor 103 has its drain connected to the gate of DMOS transistor 101.

Figure 12:
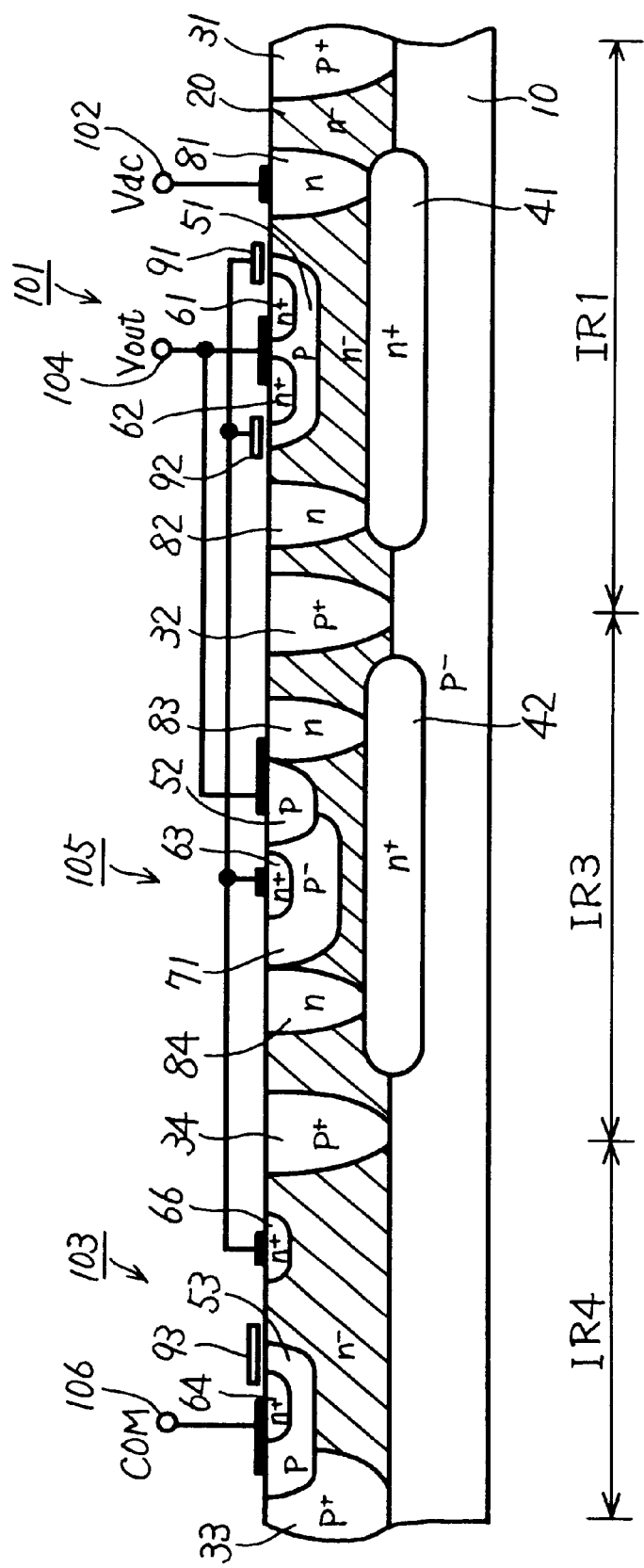
FIG. 12 is a schematic cross sectional view showing a structure of a conventional semiconductor device.

This semiconductor device differs from the conventional device of FIG. 12 in that Zener diode 105 and DMOS transistor 103 are formed within the same island region IR2. More particularly, isolating diffused region 34 and diffused region 66 shown in FIG. 12 are not provided in this semiconductor device, and instead of the omitted diffused region 66, diffused region 84 is connected to the gate of DMOS transistor 101. Accordingly, diffused region 84 functions as the drain of DMOS transistor 103 in this Embodiment 1.

In the above-described semiconductor device, a power supply terminal 102 is supplied with a high power supply voltage Vdc (of, for example, 100 V) while a ground terminal 106 is connected to the ground. Logic signals which are complementary to each other generated by logic circuit (not shown) in this semiconductor device are applied to the gates of DMOS transistors 103 and 113, respectively. Accordingly, when DMOS transistor 113 is turned on, DMOS transistor 103 is turned off. On the contrary, when DMOS transistor 113 is turned off, DMOS transistor 103 is turned on.

When DMOS transistor 113 is turned on, current flows from power supply terminal 102 to ground terminal 106 through resistor elements 109, 111 and DMOS transistor 113. Therefore, voltage is generated between the two ends of resistor element 109, and bipolar transistor 107 is turned on. Accordingly, current flows from power supply terminal 102 to the gate of DMOS transistor 101 through bipolar transistor 107, thereby charging this gate. When the gate voltage of DMOS transistor 101 is increased, DMOS transistor 101 is turned on so that output voltage Vout is increased from the ground voltage to reach high power supply voltage Vdc eventually. When bipolar transistor 107 is turned on, the gate voltage of DMOS transistor 101 is increased nearly to power supply voltage Vdc, but increase of output voltage Vout is slightly delayed from this increase of gate voltage. Accordingly, a high power supply voltage is temporarily applied between the gate and the source of DMOS transistor 101. However, since Zener diode 105 is connected in parallel between the gate and the source of DMOS transistor 101, the gate oxide film of DMOS transistor 101 would not be destroyed.

Meanwhile, when DMOS transistor 103 is turned on, the gate of DMOS transistor 101 is discharged by DMOS transistor 103, thereby turning off DMOS transistor 101. Then, output terminal 104 is short-circuited to ground terminal 106 via Zener diode 105 and DMOS transistor 103. Accordingly, output voltage Vout drops down from the high power supply voltage Vdc and eventually reaches ground voltage COM.

According to this Embodiment 1, since Zener diode 105 and DMOS transistor 103 are formed within the same island region IR2, the chip size is reduced. More particularly, the chip is made shorter by the distance between diffused regions 66 and 84 (which is a portion forming a ring shape when observed from above) in the conventional structure shown in FIG. 12. Conversely, since margin is created around the chip, it is also possible to increase the size of DMOS transistor 103. When the size of DMOS transistor 103 is made larger, its on-resistance can be made small such that it would be possible to increase the dropping rate of output voltage Vout.

[Embodiment 2]

Figure 3:
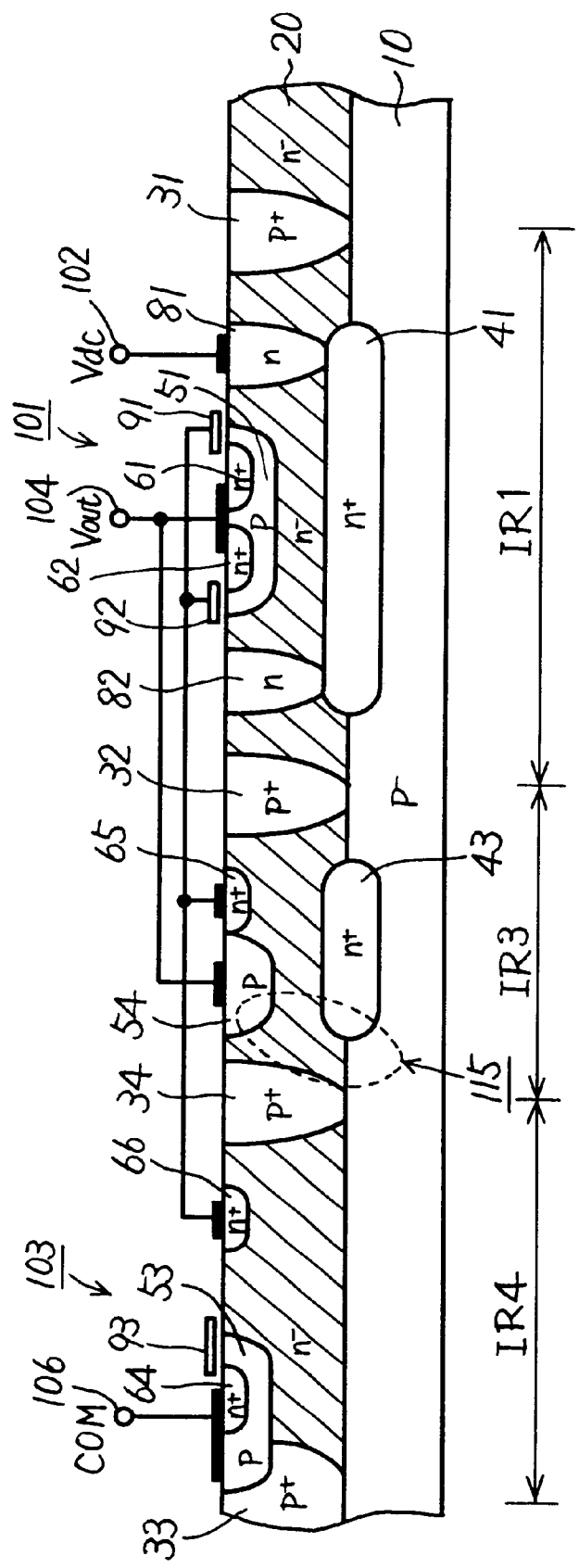
FIG. 3 is a schematic cross sectional view showing a structure of a semiconductor device according to Embodiment 2 of the present invention.
Figure 4:
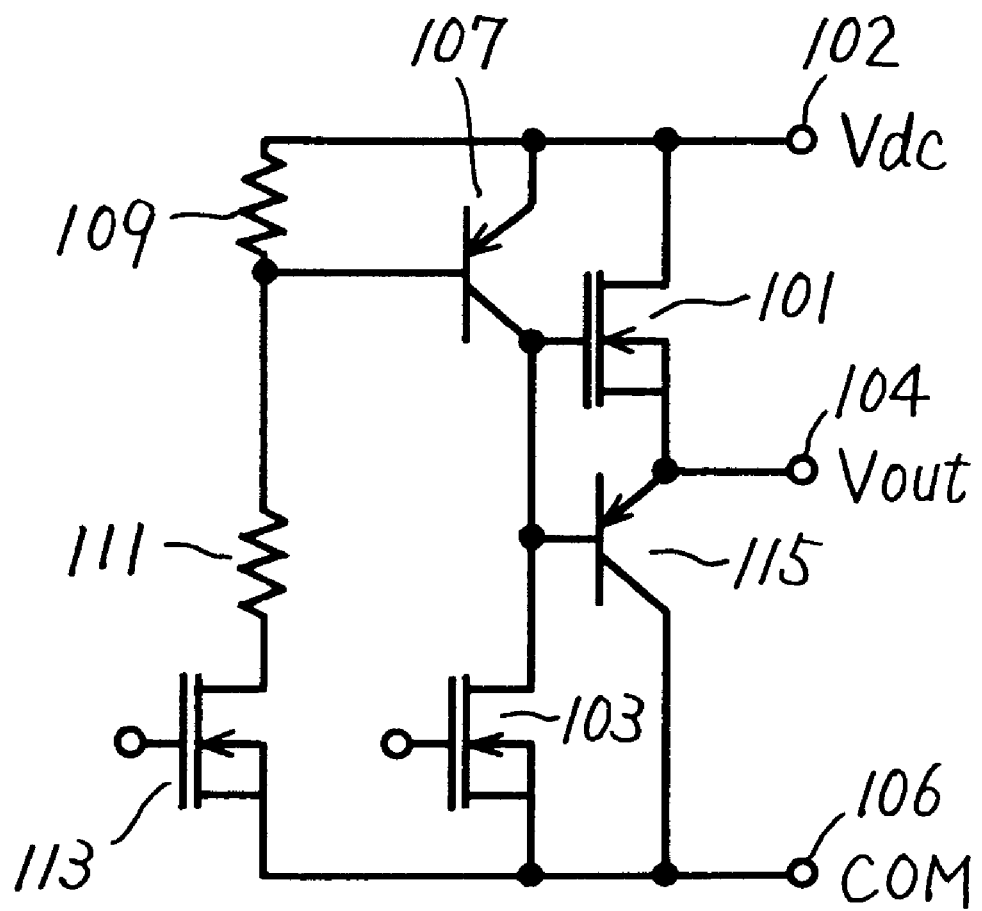
FIG. 4 shows an equivalent circuit of the semiconductor device of FIG. 3.

FIG. 3 is a schematic cross sectional view showing a structure of a semiconductor device according to Embodiment 2 of the present invention. FIG. 4 shows an equivalent circuit of the structure shown in FIG. 3. Embodiment 2 differs from Embodiment 1 of FIG. 1 in that it has an epitaxial layer 20 electrically isolated into island regions IR1, IR3, IR4 by isolating diffused regions 31 to 34. In addition, a pnp bipolar transistor 115 instead of Zener diode 105 is formed in island region IR3. An DMOS transistor 103 is formed in island region IR4. The structure of DMOS transistor 101 is completely the same as the one shown in FIG. 1. Also, the structure of DMOS transistor 103 is completely the same as the one shown in FIG. 12.

Bipolar transistor 115 has an emitter formed by a p type diffused region 54, a base formed by epitaxial layer 20, and a collector formed by a semiconductor substrate 10. The emitter of bipolar transistor 115 is connected to an output terminal 104. The base of bipolar transistor 115 is connected to the gate of DMOS transistor 101 and the drain of DMOS transistor 103 through an $n^+$ type diffused region 65. The collector of bipolar transistor 115 is connected to a ground terminal 106 through isolating diffused region 33 and a diffused region 53. Accordingly, this pnp bipolar transistor 115 has a vertical structure.

According to this Embodiment 2, since bipolar transistor 115 is provided instead of the Zener diode, the dropping rate of output voltage Vout can be increased. This is because a base current flows into bipolar transistor 115 when DMOS transistor 103 is turned on, and a collector current which is hFE times as large as that base current is made to flow. In addition, although there is no Zener diode connected in series between the gate and the source of DMOS transistor 101, a pn junction of bipolar transistor 115 is connected instead, and thus this pn junction functions as the Zener diode. Accordingly, the gate oxide film of DMOS transistor 101 would not be destroyed even when a high voltage is applied between the gate and the source of DMOS transistor 101.

Furthermore, since a buried diffused region 43 is formed at the interface of semiconductor substrate 10 and epitaxial layer 20 within island region IR3, the breakdown voltage of bipolar transistor 115 is made higher. In addition, since $n^+$ type diffused region 65 is in slight contact with p type diffused region 54 forming the emitter of bipolar transistor 115, the Zener voltage of the parasitic Zener diode in bipolar transistor 115 is made lower. Accordingly, the gate oxide film of DMOS transistor 101 can be protected from high voltage effectively.

[Embodiment 3]

Figure 5:
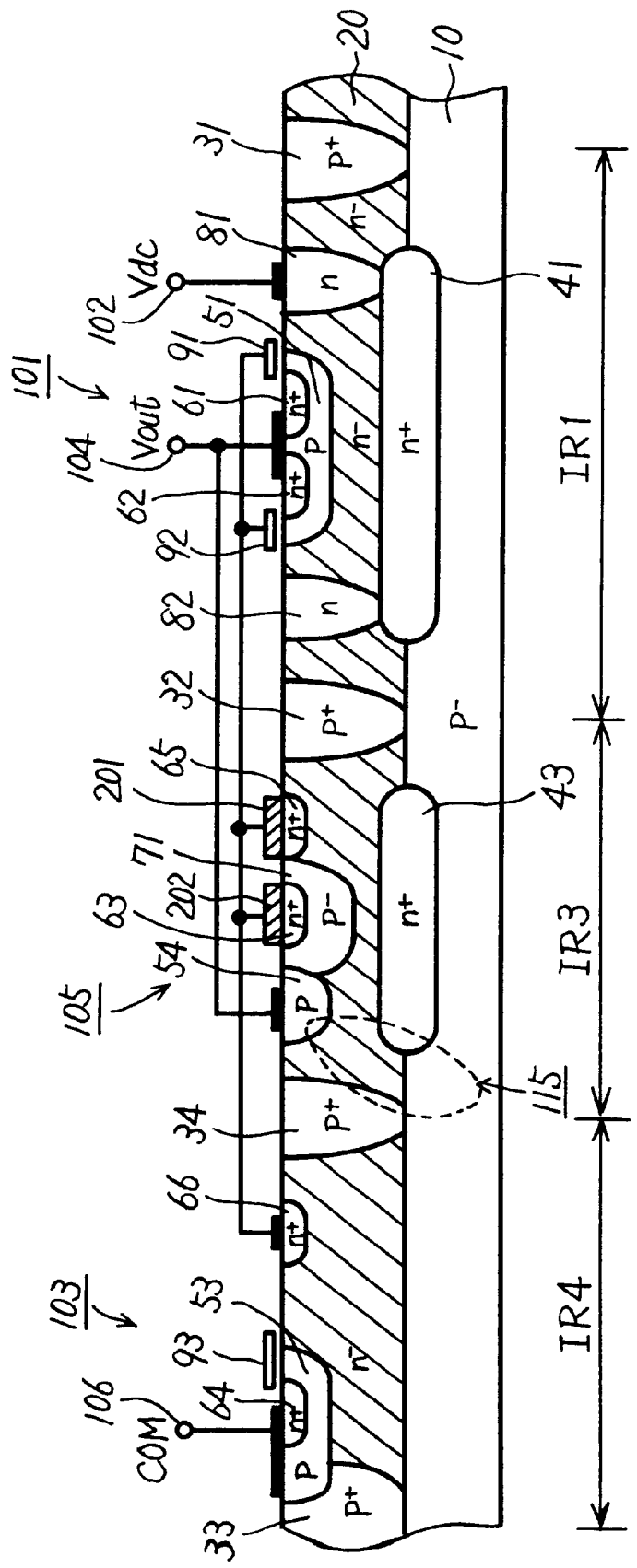
FIG. 5 is a schematic cross sectional view showing a structure of a semiconductor device according to Embodiment 3 of the present invention.
Figure 6:
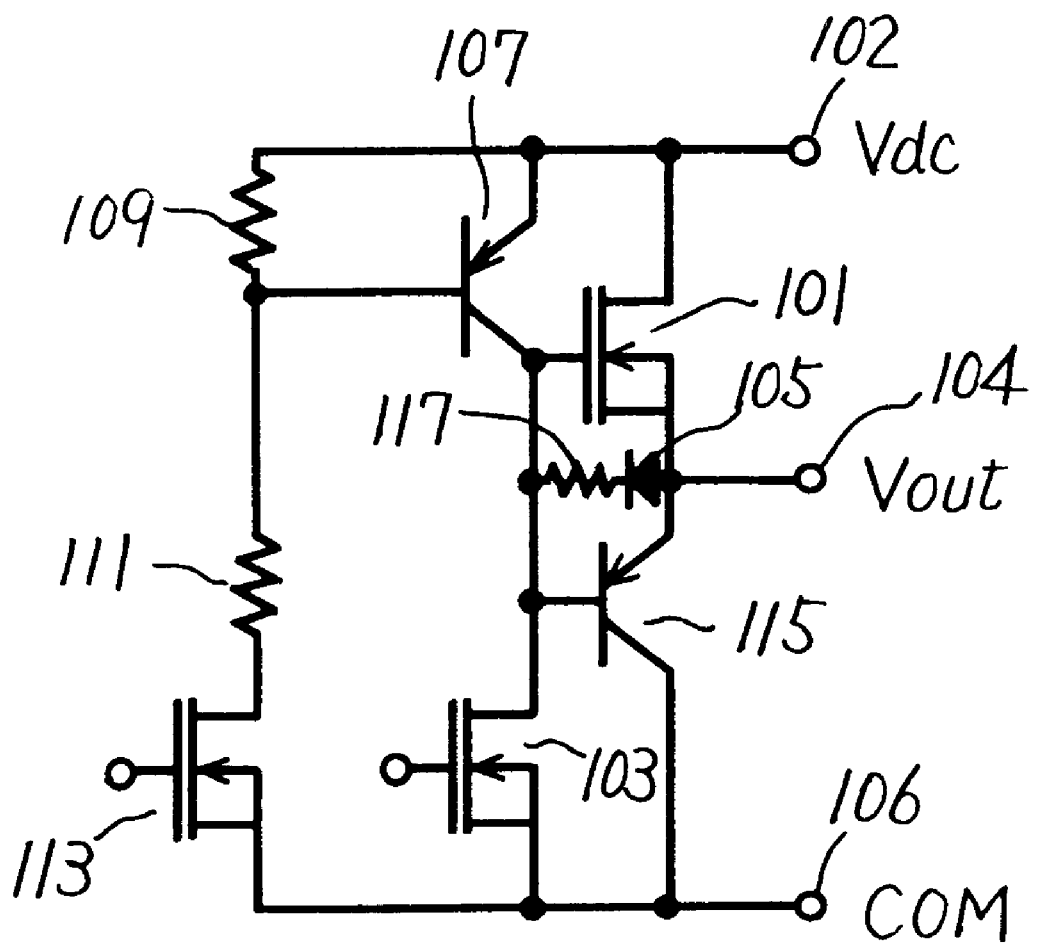
FIG. 6 shows an equivalent circuit of the semiconductor device of FIG. 5.

FIG. 5 is a schematic cross sectional view showing a structure of a semiconductor device according to Embodiment 3 of the present invention. FIG. 6 shows an equivalent circuit of the structure shown in FIG. 5. This Embodiment 3 differs from Embodiment 2 in FIG. 3 in that it has a Zener diode 105 in addition to pnp bipolar transistor 115 within an island region IR3. This Zener diode 105 has an anode formed by a $p^-$ type diffused region 71 and a cathode formed by an $n^+$ type diffused region 63. A diffused region 65 which is in slight contact with diffused region 71 also functions as a cathode. On this diffused regions 63 and 65, polycrystalline silicon films 201 and 202 are formed, respectively. Polycrystalline silicon films 201 and 202 function as a resistor element 117. Accordingly, the cathode of Zener diode 105 is connected to the gate of a DMOS transistor 101 through resistor element 117. The anode of Zener diode 105 is connected to the source of DMOS transistor 101.

According to this Embodiment 3, since Zener diode 105 is connected in parallel between the emitter and the base of bipolar transistor 115, it is ensured that destruction of the gate oxide film of DMOS transistor 101 can be prevented even when the Zener voltage of the parasitic Zener diode in bipolar transistor 115 is large. This is because the clamp voltage between the gate and the source of DMOS transistor 101 is determined by the newly provided Zener diode 105 instead of the parasitic Zener diode in bipolar transistor 115.

In addition, since resistor element 117 is connected in series with Zener diode 105, injection efficiency of the hole into bipolar transistor 115 would not be reduced even when the forward voltage Vf between the emitter and the base of bipolar transistor is larger than the forward voltage Vf of Zener diode 105, since there would be a voltage drop at resistor element 117 such that the voltage across Zener diode 105 would be made lower. In other words, resistor element 117 increases the apparent forward voltage of Zener diode 105. The required amount of voltage drop at resistor element 117 is only about a few volts. This resistor element 117 increases the resistance owing to Zener avalanche current, which in general is approximately as large as the current upon application of forward bias. Accordingly, it does not significantly affect the operation actually, since the voltage drop owing to the resistance at the time of avalanche is only about a few volts.

Although resistor element 117 is connected in series with Zener diode 105 in this Embodiment 3, this resistor element 117 does not have to be connected when the forward voltage between the emitter and the base of bipolar transistor 115 is smaller than the forward voltage of Zener diode 105.

[Embodiment 4]

Figure 7:
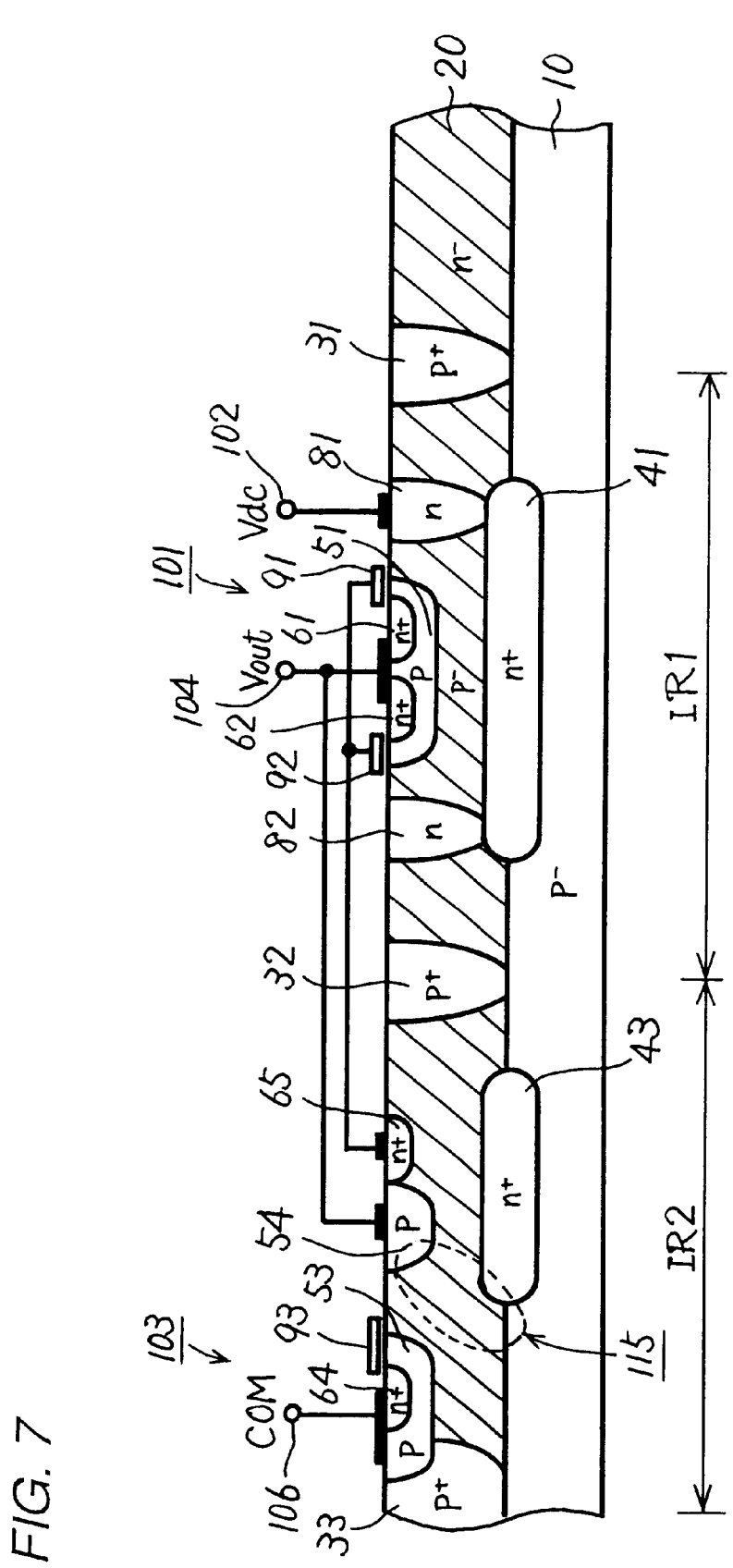
FIG. 7 is a schematic cross sectional view showing a structure of a semiconductor device according to Embodiment 4 of the present invention.

FIG. 7 is a schematic cross section showing a structure of a semiconductor device according to Embodiment 4 of the present invention. The equivalent circuit of this structure is identical to the one shown in FIG. 4. This Embodiment 4 differs from Embodiment 2 of FIG. 3 in that it has a pnp bipolar transistor 115 and a DMOS transistor 103 formed in the same island region IR2. More particularly, isolated diffused region 34 and diffused region 66 in FIG. 3 are not provided in this Embodiment 4. Accordingly, the size of the chip is reduced by the distance between diffused regions 54 and 66. The drain of DMOS transistor 103 in this Embodiment 4 is connected to the gate of a DMOS transistor 101 through a diffused region 65. Thus, these bipolar transistor 115 and DMOS transistor 103 form an insulated gate type bipolar transistor (IGBT).

In addition, by thus increasing the complexity of the transistors, the electron current from DMOS transistor 103 and the hole current of bipolar transistor 115 flows into an epitaxial layer 20 simultaneously so that conductivity of epitaxial layer 20 is modulated, increasing the electron current of DMOS transistor 103. Accordingly, provided that hFE of bipolar transistor 115 is the same as that of Embodiment 2, collector current of bipolar transistor 115 is increased by the same rate as that of the increase in the electron current owing to the conductivity modulation. Therefore, the dropping rate of output voltage Vout is made faster than that of Embodiment 2.

As in the case of Embodiment 2, a parasitic Zener diode in bipolar transistor 115 prevents destruction of gate oxide film of DMOS transistor 101. A Zener diode 105 may also be added as in the above-described Embodiment 3, and furthermore, a resistor element 117 may also be added.

[Embodiment 5]

Figure 8:
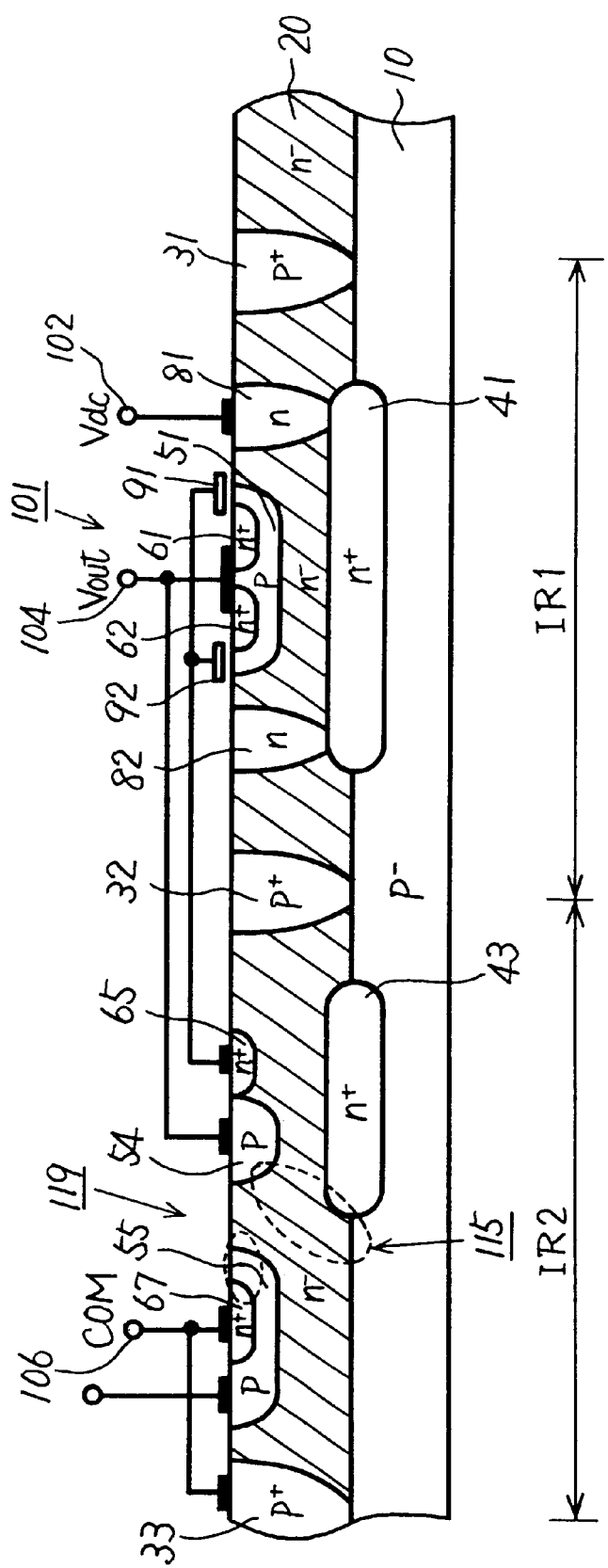
FIG. 8 is a schematic cross sectional view showing a structure of a semiconductor device according to Embodiment 5 of the present invention.
Figure 9:
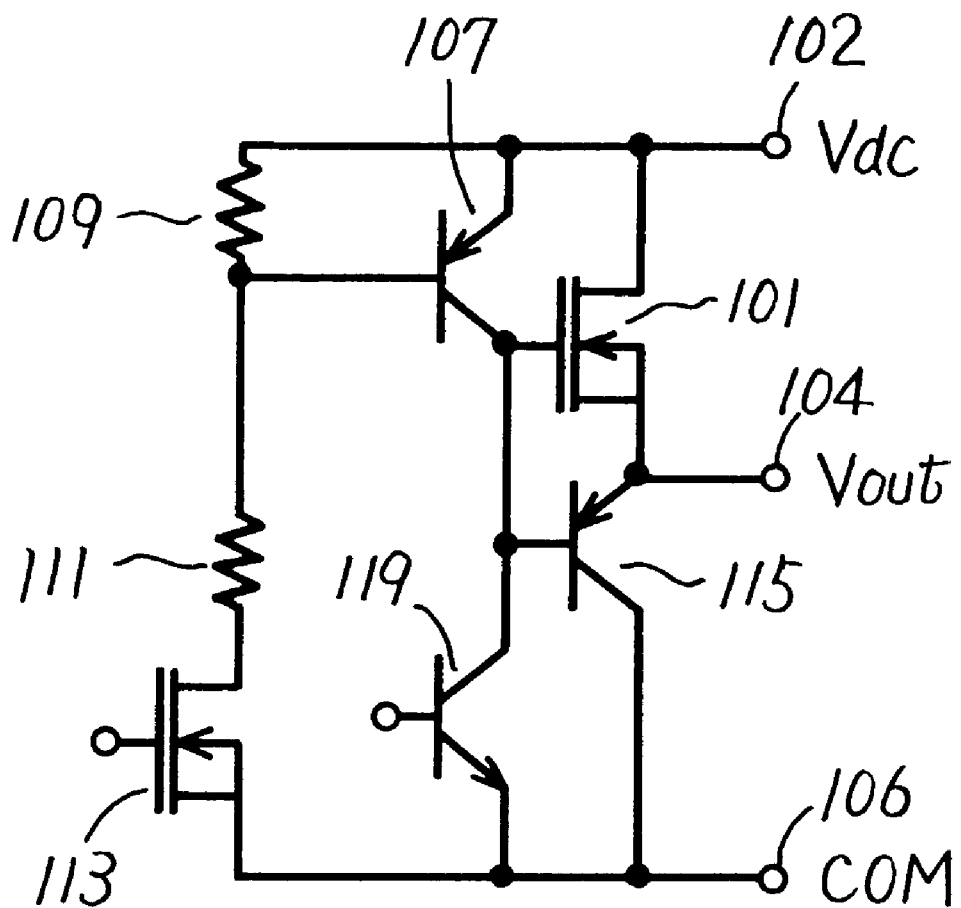
FIG. 9 shows an equivalent circuit of a semiconductor device of FIG. 8.

FIG. 8 is a schematic cross sectional view showing a structure of a semiconductor device according to Embodiment 5 of the present invention. FIG. 9 is an equivalent circuit diagram of the structure shown in FIG. 8. This Embodiment 5 differs from Embodiment 4 shown in FIG. 7 in that it has an npn bipolar transistor 119 formed instead of DMOS transistor 103. This bipolar transistor 119 has a collector formed by an n⁻ type epitaxial layer 20, a base formed by a p type diffused region 55, and an emitter formed by an n⁺ type diffused region 67. The collector of bipolar transistor 119 is in connection with the gate of a DMOS transistor 101 through diffused region 65. The collector of a bipolar transistor 115 is in connection with a ground terminal 106. Accordingly, bipolar transistor 115 having a vertical structure and bipolar transistor 119 having a lateral structure are formed within the same island region IR2.

According to this Embodiment 5, since bipolar transistor 119 starts operating in response to a base voltage higher than a forward bias voltage Vf, this bipolar transistor 119 is turned on sufficiently in response to general logical voltage (5 V). Therefore, a sufficient collector current flows into bipolar transistor 119, and in addition, a sufficient collector current flows into bipolar transistor 115 such that the dropping rate of output voltage Vout is made faster.

A parasitic Zener diode in bipolar transistor 115 prevents destruction of gate oxide film of DMOS transistor 101. Also, as in the case of Embodiment 3, a Zener diode 105 may also be added, and furthermore, a resistor element 117 may also be added.

[Embodiment 6]

Figure 10:
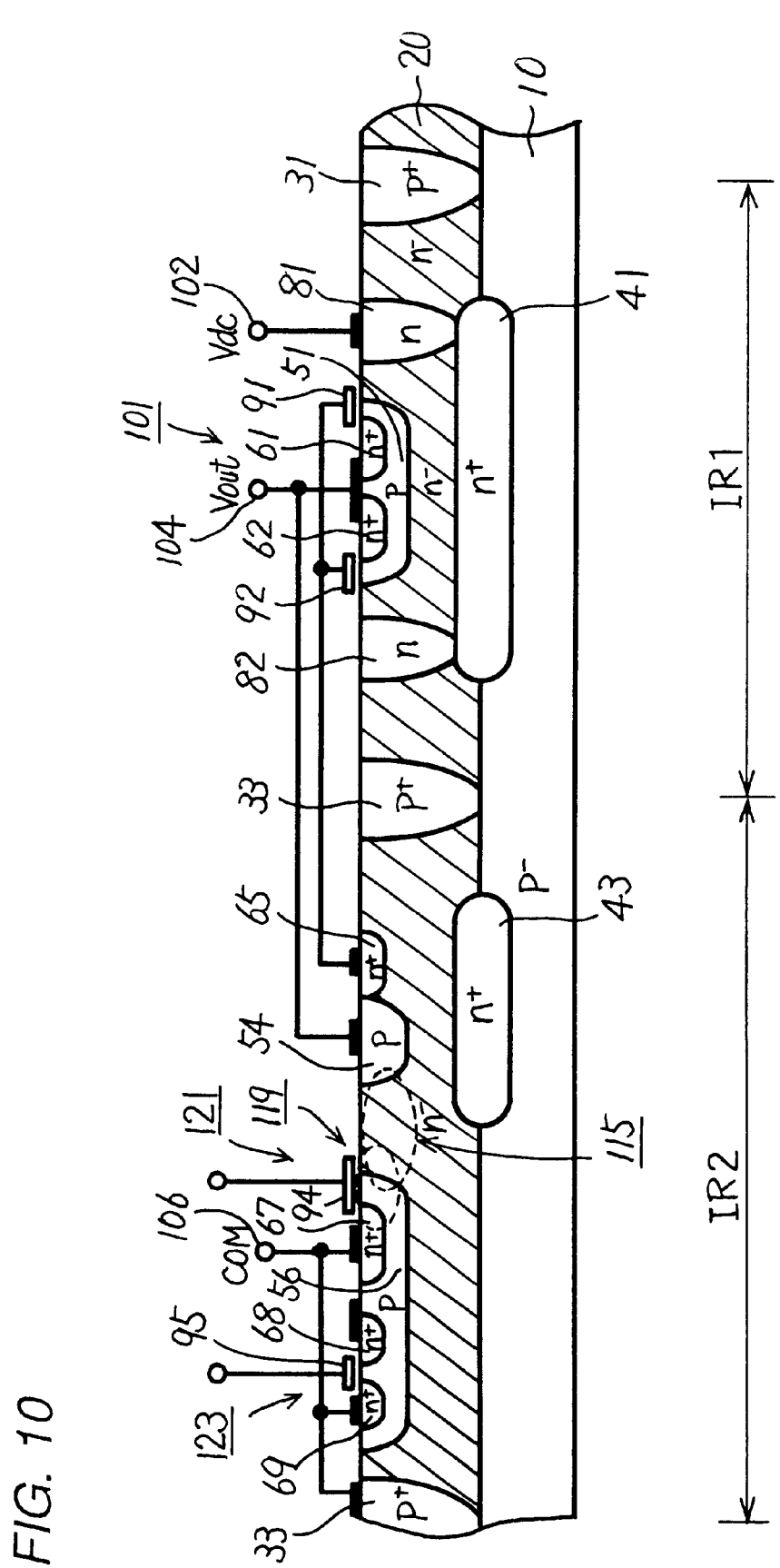
FIG. 10 is a schematic cross sectional view showing a structure of a semiconductor device according to Embodiment 6 of the present invention.
Figure 11:
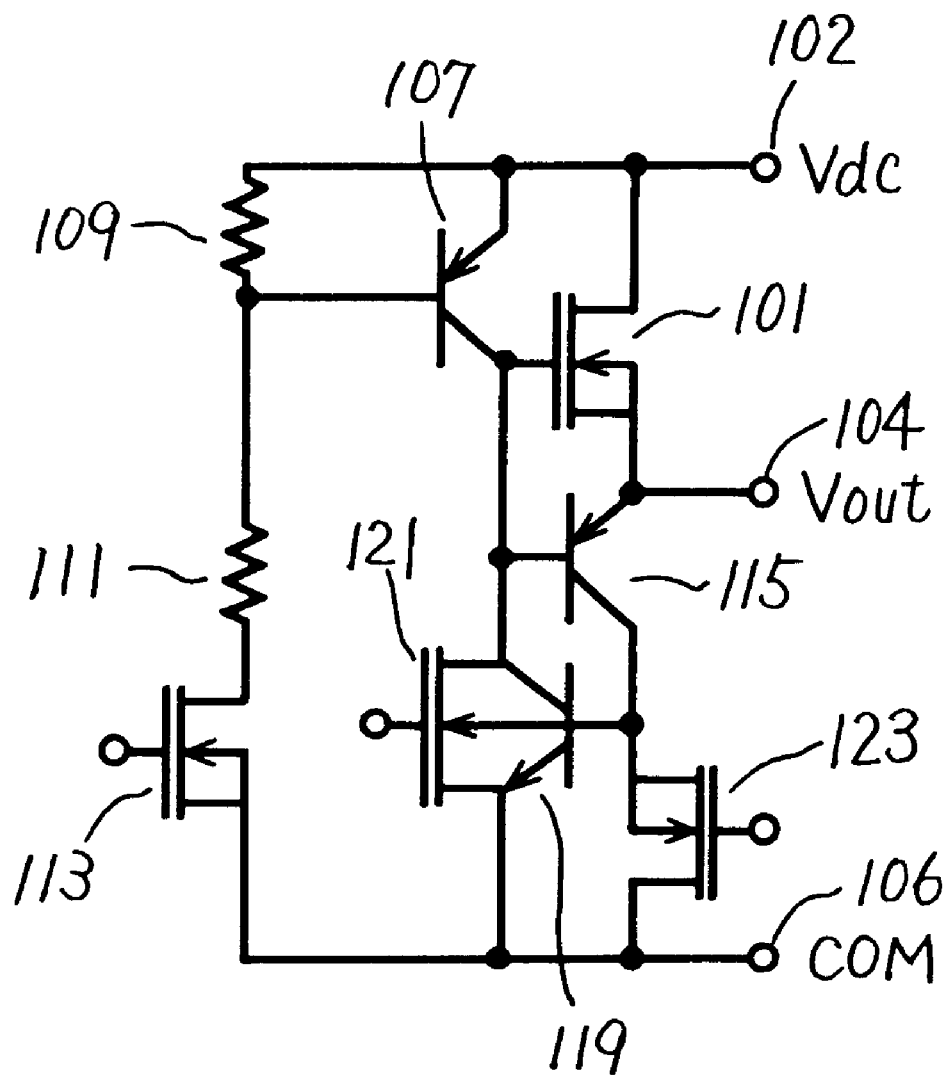
FIG. 11 shows an equivalent circuit of the semiconductor device of FIG. 10.

FIG. 10 is a schematic cross sectional view showing a structure of a semiconductor device according to Embodiment 6 of the present invention FIG. 11 is a equivalent circuit diagram of a structure shown in FIG. 10. In this Embodiment 6, n channel DMOS transistors 121 and 123 are formed within the same island region IR2 in addition to the structure of FIG. 8. DMOS transistor 121 has a drain formed by an epitaxial layer 20, a source formed by an n⁺ type diffused region 67, and a gate 94 formed of polycrystalline silicon. DMOS transistor 121 has its drain connected to the gate of a DMOS transistor 101 through a diffused region 65. The source of DMOS transistor 121 is connected to a ground terminal 106. DMOS transistor 123 has its drain connected to a p type diffused region 56. This diffused region 56 forms a collector of a bipolar transistor 115. The source of DMOS transistor 123 is connected to ground terminal 106.

Accordingly, bipolar transistors 115 and 119 form a thyristor. DMOS transistor 121 is provided to turn this thyristor on, while DMOS transistor 123 is provided to turn this thyristor off.

When DMOS transistor 121 is turned off, a base current flows into bipolar transistor 115 and a collector current which is hFE times as large as that base current flows into ground terminal 106 through the base and the emitter of bipolar transistor 119. Once the thyristor is turned on as described above, a large current flows regardless of the on-resistance of DMOS transistor 121. Therefore, the dropping rate of output voltage Vout is made faster. Meanwhile, when DMOS transistor 123 is turned on, bipolar transistor 119 is turned off, thus turning off the thyristor.

A parasitic Zener diode in bipolar transistor 115 prevents destruction of the gate oxide film of DMOS transistor 101. As in the case of Embodiment 3, a Zener diode 105 may also be added, and furthermore, a resistor element 117 may also be added.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for supplying a prescribed output voltage according to a high power supply voltage in response to an internally generated signal, comprising:

a first MOS transistor having a drain for receiving said high power supply voltage and a source for supplying said output voltage;

a pnp bipolar transistor having a base connected to a gate of said first MOS transistor, an emitter connected to the source of said first MOS transistor and a collector connected to the ground; and a second MOS transistor having a drain connected to the gate of said first MOS transistor and a source directly connected to the ground, wherein the emitter and base of the bipolar transistor form an anode and a cathode of a parasitic diode for protecting the gate of the first MOS transistor.

2. The semiconductor device according to claim 1, further including a Zener diode having an anode connected to the source of said first MOS transistor and a cathode connected to the gate of said first MOS transistor, said Zener diode is applied with both forward and reverse voltages.

3. The semiconductor device according to claim 2, further including a resistor element connected in series with said Zener diode.

4. The semiconductor device according to claim 1, wherein said bipolar transistor has a vertical structure.

5. A semiconductor device for supplying a prescribed output voltage according to a high power supply voltage in response to an internally generated signal, comprising:
- a p type semiconductor substrate connected to the ground;
- a first MOS transistor formed at said semiconductor substrate having a drain for receiving said high power supply voltage and a source for supplying said output voltage;
- a second MOS transistor formed at said semiconductor substrate having a drain connected to a gate of said first MOS transistor and a source directly connected to the ground;
- an n type conductive region formed on said semiconductor substrate connected to the gate of said first MOS transistor; and
- a p type conductive region formed in said n type conductive region connected to the source of said first MOS transistor, wherein
- the n type conductive region, the p type conductive region, and the semiconductor substrate form a base, an emitter and a collector, respectively, of a bipolar transistor, and
- the p type conductive region and n type conductive region form an anode and cathode of a parasitic diode for protecting the gate of the first MOS transistor.

6. The semiconductor device according to claim 5, further including a Zener diode having an anode connected to the source of said first MOS transistor and a cathode connected to the gate of said first MOS transistor.

7. The semiconductor device according to claim 6, wherein said Zener diode is formed in said n-type conductive region.

8. A semiconductor device for supplying a prescribed output voltage according to a high power supply voltage in response to an internally generated signal, comprising:
- a semiconductor substrate:
- a first region (IR1) formed at said semiconductor substrate;
- a first MOS transistor formed at said first region having a drain for receiving said high power supply voltage and a source for supplying said output voltage;
- a second region (IR2) formed at said semiconductor substrate being electrically isolated from said first region;
- a pnp bipolar transistor formed at said second region having a base connected to a gate of said first MOS transistor, an emitter connected to the source of said first MOS transistor and a collector connected to the ground; and
- a second MOS transistor formed at said second region having a drain connected to the gate of said first MOS transistor and a source connected to the ground, wherein
- said emitter and base of said bipolar transistor form an anode and a cathode of a parasitic diode for protecting the gate of the first MOS transistor.

9. A semiconductor device for supplying a prescribed output voltage according to a high power supply voltage in response to an internally generated signal, comprising:
- a first MOS transistor having a drain for receiving said high power supply voltage and a source for supplying said output voltage:
- a pnp bipolar transistor having a base connected to a gate of said first MOS transistor, an emitter connected to the source of said first MOS transistor and a collector connected to the ground; and
- an npn bipolar transistor having a collector connected to the gate of said first MOS transistor and an emitter connected to the ground, wherein
- the emitter and base of the pnp bipolar transistor form an anode and a cathode of a parasitic diode for protecting the gate of the first MOS transistor.

10. A semiconductor device for supplying a prescribed output voltage according to a high power supply voltage in response to an internally generated signal, comprising:
- a semiconductor substrate;
- a first region (IR1) formed at said semiconductor substrate;
- a first MOS transistor formed at said first region having a drain for receiving said high power supply voltage and a source for supplying said output voltage;
- a second region (IR2) formed at said semiconductor substrate being electrically isolated from said first region;
- a pnp bipolar transistor formed at said second region having a base connected to a gate of said first MOS transistor, an emitter connected to the source of said first MOS transistor and a collector connected to the ground; and
- an npn bipolar transistor formed at said second region having a collector connected to the gate of said first MOS transistor and an emitter connected to the ground, wherein
- the emitter and base of the pnp bipolar transistor form an anode and a cathode of a parasitic diode for protecting the gate of the first MOS transistor.

11. A semiconductor device for supplying a prescribed output voltage according to a high power supply voltage in response to an internally generated signal, comprising:
- a first MOS transistor having a drain for receiving said high power supply voltage and a source for supplying said output voltage;
- a pnp bipolar transistor having a base connected to a gate of said first MOS transistor and an emitter connected to the source of said first MOS transistor; and
- an npn bipolar having a base connected to a collector of said pnp bipolar transistor, a collector connected to the gate of said first MOS transistor and an emitter connected to the ground, wherein
- the emitter and base of the pnp bipolar transistor form an anode and a cathode of a parasitic diode for protecting the gate of the first MOS transistor.

12. The semiconductor device according to claim 11, further including:
- a second MOS transistor having a drain connected to the collector of said second bipolar transistor and a source connected to the emitter of said second bipolar transistor; and
- a third MOS transistor having a drain connected to the base of said second bipolar transistor and a source connected to the ground.

13. A semiconductor device for supplying a prescribed output voltage according to a high power supply voltage in response to an internally generated signal, comprising:

a semiconductor substrate;

a first region (IR1) formed at said semiconductor substrate;

a first MOS transistor formed at said first region having a drain for receiving said high power supply voltage and a source for supplying said output voltage;

a second region (IR2) formed at said semiconductor substrate being electrically isolated from said first region;

a pnp bipolar transistor formed at said second region having a base connected to a gate of said first MOS transistor and an emitter connected to the source of said first MOS transistor; and an npn bipolar transistor formed at said second region having a base connected to a collector of said pnp bipolar transistor, a collector connected to the gate of said first MOS transistor and an emitter connected to the ground, wherein the emitter and base of the pnp bipolar transistor form an anode and a cathode of a parasitic diode for protecting the gate of the first MOS transistor.

* * * * *